United States Patent [19]

Murakami

[11] Patent Number: 5,175,454
[45] Date of Patent: Dec. 29, 1992

[54] PROGRAMMABLE DELAY CIRCUIT HAVING N-STAGE CAPACITANCE ELEMENTS

[75] Inventor: Daisuke Murakami, Kanagawa, Japan

[73] Assignee: Sony Corporation, Tokyo, Japan

[21] Appl. No.: 838,888

[22] Filed: Feb. 21, 1992

[30] Foreign Application Priority Data

Feb. 22, 1991 [JP] Japan .................................. 3-50473

[51] Int. Cl.⁵ .......................................... H03K 5/159
[52] U.S. Cl. .................................... 307/603; 307/605; 307/608; 307/595; 307/597; 328/55
[58] Field of Search ............... 307/603, 605, 608, 595, 307/597; 328/55

[56] References Cited

U.S. PATENT DOCUMENTS

| | | | |
|---|---|---|---|
| 4,797,586 | 1/1989 | Traa | 307/608 |
| 4,866,314 | 9/1989 | Traa | 307/608 |
| 5,006,738 | 4/1991 | Usuki et al. | 307/605 |
| 5,063,311 | 11/1991 | Swapp | 307/603 |

Primary Examiner—Andrew J. James
Assistant Examiner—Trong Phan
Attorney, Agent, or Firm—Hill, Van Santen, Steadman & Simpson

[57] ABSTRACT

A programmable delay circuit comprising input terminals supplied with input signals to be delayed; output terminals for delivering the delayed signals therefrom; resistance elements inserted between the input terminals and the output terminals; n-stage capacitance elements having capacitance values of $C$, $2C$, $4C$ ... $2^{n-1}C$ respectively (where C is a unit capacitance value) and each connected at one end thereof to the output ends of the resistance elements; and n-stage selection means for selectively applying to the other ends of the n-stage capacitance elements either a signal having an opposite-phase or in-phase relation to the input signal, or a reference potential level. The delay circuit is capable of performing a control operation relative to any short delay time on the order of picosecond and still ensuring satisfactory linearity in the delay characteristics.

3 Claims, 5 Drawing Sheets

PROGRAMMABLE DELAY CIRCUIT HAVING N-STAGE CAPACITANCE ELEMENTS

BACKGROUND OF THE INVENTION

1. Field of the Invention

The present invention relates to a delay circuit and, more particularly, to a programmable delay circuit excellent in the linearity of delay characteristics and adapted for use in an IC tester or the like.

2. Description of the Prior Art

A conventional example will be described below with reference to the accompanying drawings.

FIG. 1 is a circuit diagram showing the basic configuration of a known programmable delay circuit. In this diagram, reference numerals 5a and 5b denote input terminals fed with input signals to be delayed, such as clock pulse signals. For example, input signals having mutually opposite phases are supplied to the input terminals 5a and 5b. Denoted by 1 is a delay circuit comprising series-connected N stages G1 to Gn (where $N \geq 2$), wherein input electrodes (bases) of a pair of differential amplifying transistors P11 and P12 are connected between the first delay stage G1 and the second delay stage G2 of the delay circuit 1, and output electrodes (collectors) of such transistors constitute a buffer 2 while being connected respectively to common output terminals VOUT and VOUTB via cascode-connected transistors Pb1 and Pb2. Denoted by R1a and R2a are load resistors connected to a power terminal Vref (e.g. ground) and common output terminals VOUT and VOUTB respectively. There are also included a current switch 3 consisting of transistors P1 to Pn-1, and a common current source 4 having a current value Iref. The differential amplifying transistors P11, P12 and the transistor P1 of the current switch 3 constitute a first differential amplifier D1. Meanwhile, differential amplifying transistors P21, P22 connected between the second and third delay stages G2, G3 and the transistor P2 of the current switch 3 constitute a second differential amplifier D2; and differential amplifying transistors Pn-11, Pn-12 connected between the third and Nth delay stages G3, Gn and the transistor Pn-1 of the current switch 3 constitute an (N-1)th differential amplifier Dn-1. There is further included a control circuit 5 for selectively controlling the current switch 3 in such a manner as to control one of the transistors P1 to Pn-1 of the current switch 3 in response to k-bit digital signals $d_1$ to $d_k$.

Now a description will be given on the operation performed in the above circuit configuration.

In FIG. 1, if the transistor P1 of the current switch 3 is selected in response to digital signals $d_1$ to $d_k$ of the control circuit 5, the transistor P1 is turned on to supply a current Iref of the common current source 4 to the differential amplifying transistors P11 and P12 of the first differential amplifier D1, so that the signals fed to the input terminals 5a and 5b are delivered to the first delay stage G1, whose outputs are amplified by the first differential amplifier D1 and then are supplied to the common output terminals VOUT and VOUTB via the buffer 2. Similarly, if the transistor P2 of the current switch 3 is selected, the transistor P2 is turned on to supply the current Iref of the common current source 4 to the differential amplifying transistors P21 and P22 of the second differential amplifier D2, so that the signals fed to the input terminals 5a and 5b are delivered to the second delay stage D2, whose outputs are amplified by the second differential amplifier D2 and then are supplied to the common output terminals VOUT and VOUTB via the buffer 2. Thus, the outputs of the n-1 delay stages G1 through Gn-1 can be selectively outputted by controlling the current switch 3 for the plural differential amplifiers D1 through Dn-1 in response to the control signals A1 through An-1 obtained from the control circuit 5. And in selecting any of the transistors P1 through Pn-1 of the current switch 3 for the plural differential amplifiers D1 through Dn-1, the delay caused by any of the differential amplifiers D1 through Dn-1 is maintained constant and the fixed delay time is shortened to consequently achieve satisfactory linearity of the delay characteristics. In addition, the power consumption can be reduced due to the use of a single common current source 4.

Furthermore, since the cascode-connected buffer 2 is provided between the outputs of the differential amplifiers D1 to Dn-1 and the common output terminals VOUT and VOUTB, the apparent output capacitance of each of the differential amplifying transistors P11 to Pn-12 is rendered smaller to consequently realize a faster operation. And the delay time can further be prolonged by additionally providing an unshown another differential amplifier at the output of the Nth delay stage Gn.

FIG. 2 is a concrete circuit diagram of the conventional programmable delay circuit shown in FIG. 1. A description will now be given below with regard to this circuit diagram.

In FIG. 2, the component elements corresponding to those used in FIG. 1 are denoted by the same reference numerals, and a detailed explanation thereof is omitted.

In this diagram, the delay circuit 1 of FIG. 1 comprises eight stages, i.e., a 1st delay stage G1 to an 8th delay stage D8, each of which consists of an emitter follower circuit and a differential amplifier. Transistors P1 to P8 constituting a current switch 3 for a 1st differential amplifier D1 to an 8th differential amplifier D8 are controlled by control signals A1 to A8 obtained from an unshown control circuit. If the delay time of each delay stage is 100 psec in this conventional example of FIG. 2, the total delay time is changeable in a range from 100 to 800 psec (e.g., 10 nsec when $2^n = 128$), so that the same effect as in the circuit of FIG. 1 is rendered expectable. In the example of FIG. 2 where input pulse signals are transmitted in push-pull phase opposition, the duty ratio of the input pulse signals can be maintained constant until the output.

In the delay circuit of the constitution mentioned above, the delay caused by each differential amplifier is constant regardless of selection of any current switch for the plural differential amplifiers, thereby enhancing the linearity of the delay characteristics. And another advantage is attainable with respect to reduction of the power consumption due to employment of a single common current source. However, since each delay stage consists of an emitter follower circuit and a differential amplifier, the settable delay time in each delay stage is limited to 100 psec or so, hence raising a problem that a control operation is impossible relative to any short delay time on the order of picosecond for example.

OBJECT AND SUMMARY OF THE INVENTION

It is therefore an object of the present invention to provide an improved delay circuit which is capable of performing a control operation relative to any short delay time on the order of picosecond and still ensuring satisfactory linearity in the delay characteristics.

According to one aspect of the present invention, the delay circuit comprises input terminals fed with input signals to be delayed; output terminals for delivering the delayed signals therefrom; resistance elements inserted between the input terminals and the output terminals; n-stage capacitance elements having capacitance values of $C$, $2C$, $4C$ ... $2^{n-1}C$ respectively (where C is a unit capacitance value) and each connected, at one end thereof, in common to the output terminals of the resistance elements; and n-stage selection means for selectively applying to the other ends of the n-stage capacitance elements either a signal having an opposite-phase or in-phase relation to the input signal, or a reference potential level.

In the delay circuit of the present invention, the apparent capacitance value of each capacitance element can be changed by applying or not applying a signal, which has an opposite-phase or in-phase relation to the input signal, to the other ends of the n-stage capacitance elements each connected at one end thereof to the output ends of the resistance elements. In this manner, a desired delay time is settable by controlling the capacitance C of the CR time constant circuit. Furthermore, since the base-collector coupling capacitance of each transistor or the base-emitter junction capacitance thereof is used as the unit capacitance value C, none of the direct current comes to flow into the resistance element even by switching the capacitance C of the CR time constant circuit in accordance with the base-collector coupling capacitance or the base-emitter junction capacitance, so that excellent linearity can be achieved in the delay characteristics on the order of picosecond.

The above and other features and advantages of the present invention will become apparent from the following description which will be given with reference to the illustrative accompanying drawings.

DESCRIPTION OF THE PREFERRED EMBODIMENT

Hereinafter an exemplary embodiment of the present invention will be described in detail with reference to the accompanying drawings.

Figure 1:
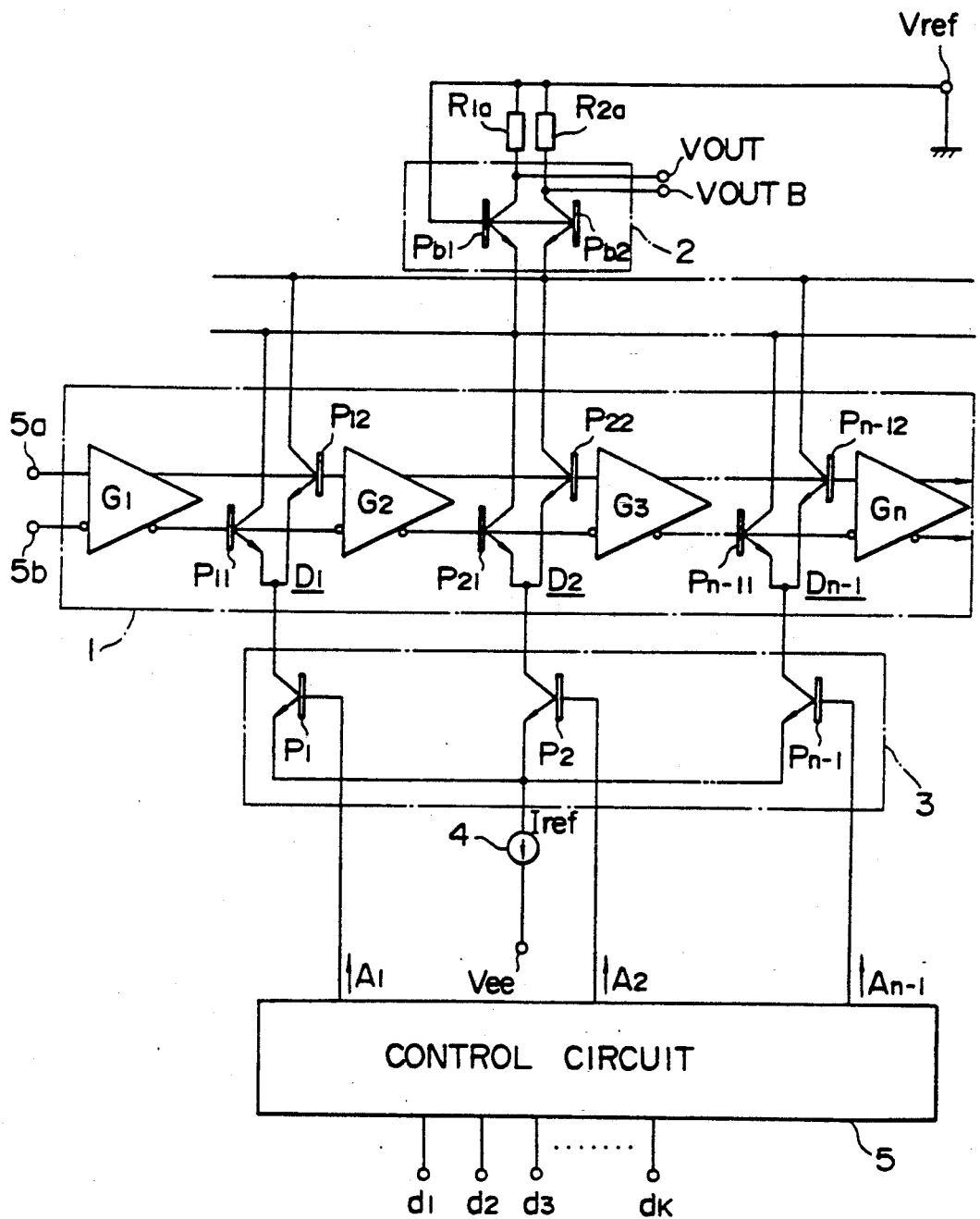
FIG. 1 is an exemplary circuit diagram showing the basic configuration of a conventional programmable delay circuit.
Figure 2:
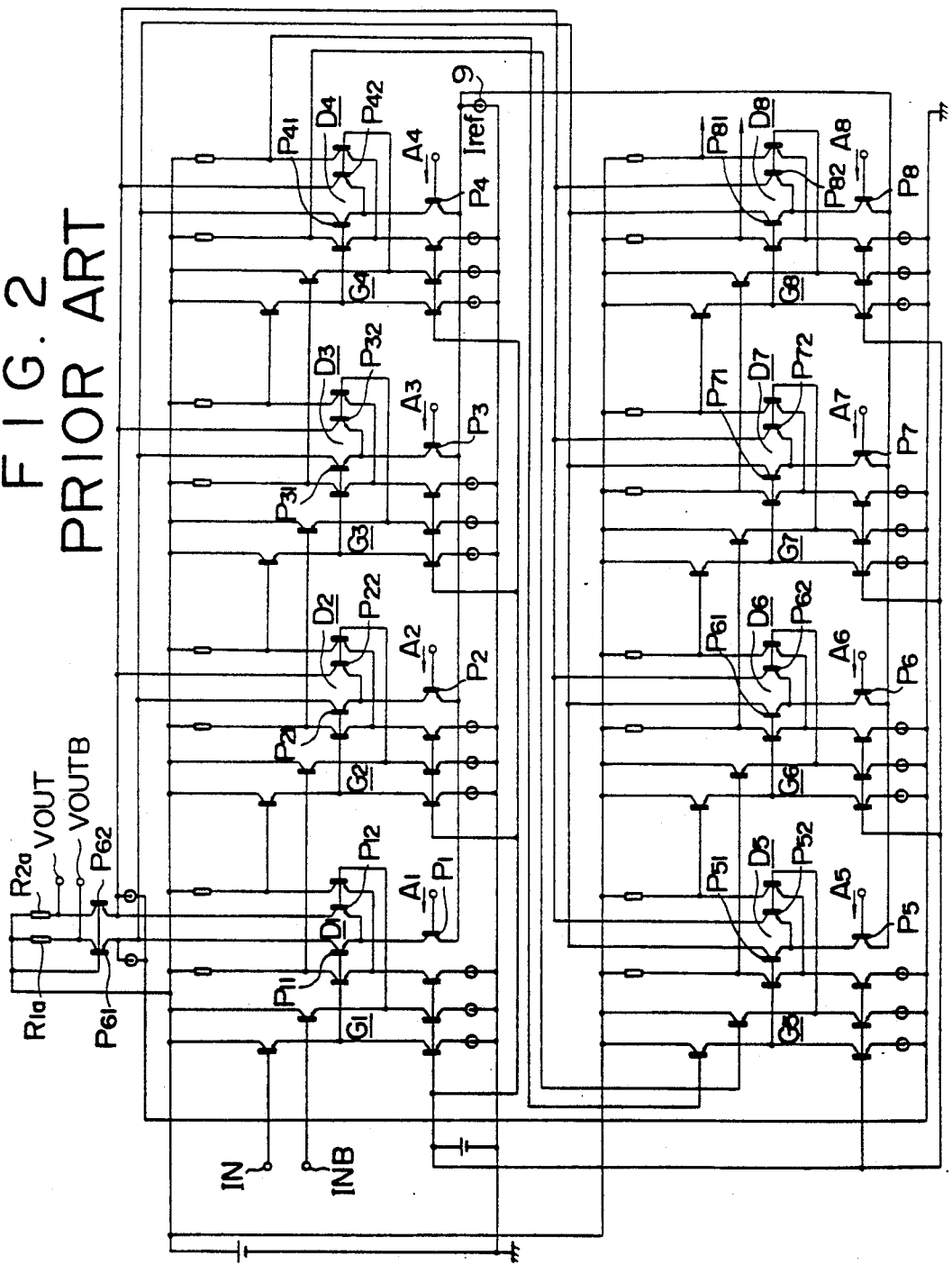
FIG. 2 is a concrete circuit diagram of the conventional programmable delay circuit shown in FIG. 1.
Figure 3:
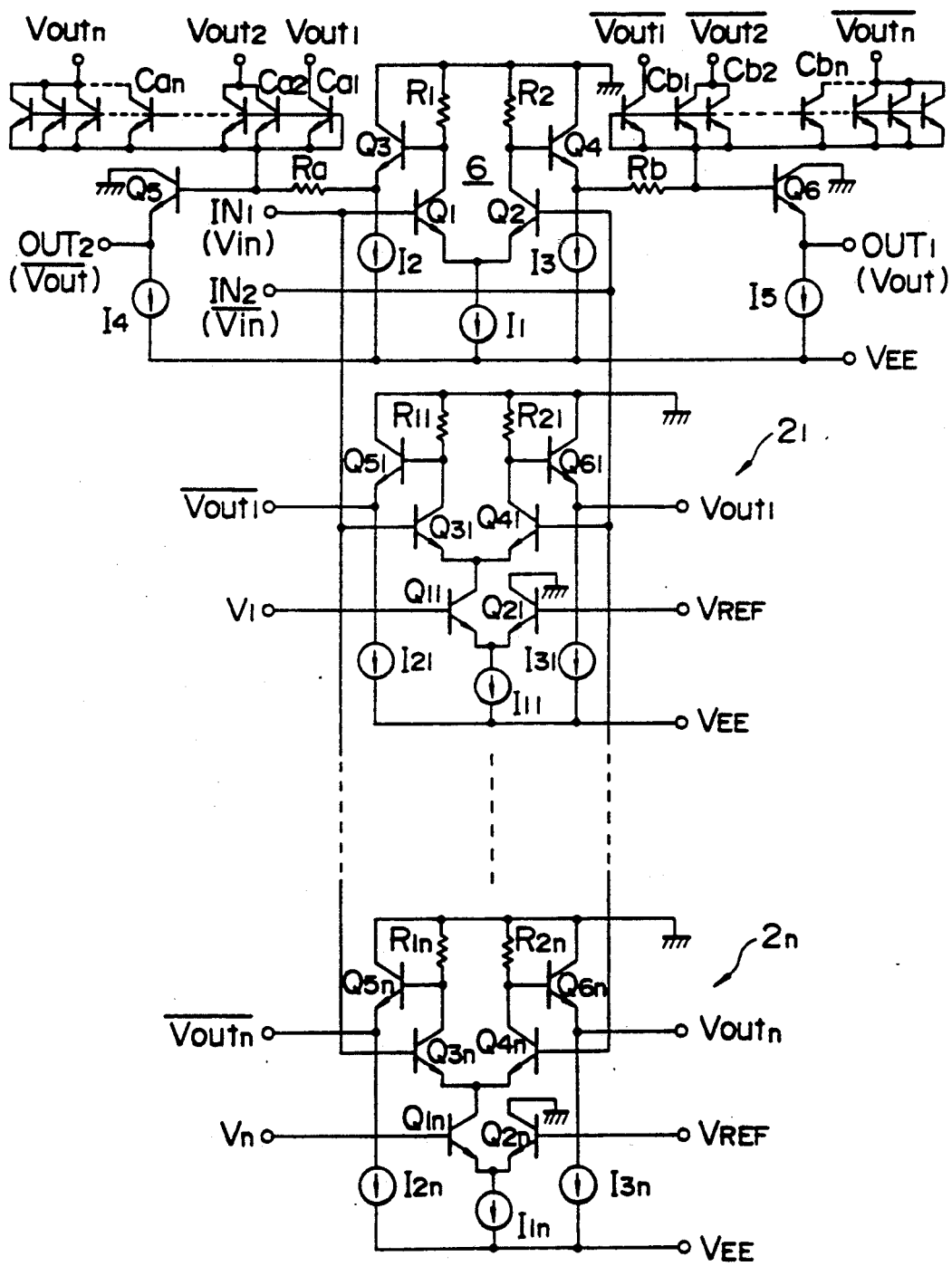
FIG. 3 is a circuit diagram of a preferred embodiment representing the programmable delay circuit of the present invention.

FIG. 3 is a circuit diagram of a preferred embodiment representing the programmable delay circuit of the present invention. In this diagram, input signals Vin and Vin to be delayed are fed to input terminals IN1, IN2 and then are supplied between the bases of paired differential transistors Q1, Q2 of which emitters are mutually connected to constitute a differential amplifier 6. The collectors of the paired differential transistors Q1, Q2 are grounded via resistors R1, R2 respectively, and the common emitter joint thereof is connected via a current source $I_1$ to a power source $V_{EE}$. Bases of emitter follower transistors Q3, Q4 are connected respectively to the collectors of the paired differential transistors Q1, Q2. The collectors of the transistors Q3, Q4 are both grounded, and the emitters thereof are connected to the power source $V_{EE}$ via the current sources $I_2$, $I_3$ respectively while being connected also to the bases of emitter follower transistors Q5, Q6 respectively via resistors Ra, Rb. The collectors of the transistors Q5, Q6 are both grounded, and the emitters thereof are connected to the power source $V_{EE}$ via current sources $I_4$, $I_5$ respectively while being connected also to output terminals OUT1, OUT2. And output signals Vout, Vout delayed by the delay circuit are delivered from such output terminals OUT1, OUT2.

The n-stage capacitance elements Ca1, Ca2 ... Can and Cb1, Cb2 ... Cbn (where n is an integer) are each connected, at one end thereof, to the output ends of the resistors Ra, Rb inserted between the input terminals IN1, IN2 and the output terminals OUT1, OUT2 respectively. The capacitance elements in the individual stages have capacitance values of $C$, $2C$ ... $2^{n-1}C$ in sequence from the first stage, where C is a unit capacitance value. In this embodiment, the unit capacitance value C is based on the base-collector junction capacitance Cjc of the transistor whose emitter and base are short-circuited. To the other ends of such capacitance elements Ca1, Ca2 ... Can and Cb1, Cb2 ... Cbn, there are connected n-stage selectors $2_1$ to $2_n$ for selectively applying either a signal of the opposite phase with respect to the input signal Vin or a reference potential level (in this embodiment, ground level). Such selectors $2_1$ to $2_n$ are connected in parallel between the input terminals IN1 and IN2, and one or more selectors supplied with external control voltages V1 to Vn are activated to apply a signal, which has an opposite-phase relation to the input signal Vin, to the other ends of the relevant capacitance elements, or apply the reference potential level thereto when being in a nonactivated state. The control voltages V1 to Vn thus supplied are digital code signals corresponding to arbitrary delay times preset externally.

The n-stage selectors $2_1$ to $2_n$ have the same circuit configuration individually. Now a concrete circuit configuration of one selector $2_1$ will be described below.

The control voltage V1 supplied from an external source is inputted to the base of one transistor Q11 of the paired differential transistors Q11, Q21 whose emitters are connected to each other, while the predetermined reference voltage $V_{REF}$ is applied to the base of the other transistor Q21. The common emitter joint of the paired differential transistors Q11, Q21 is connected via a current source $I_{11}$ to a power source $V_{EE}$. The collector of the transistor Q21 is grounded, while the collector of the transistor Q11 is connected to the common emitter joint of paired differential transistors Q31, Q41. The bases of the paired differential transistors Q31, Q41 are connected respectively to the input terminals IN1, IN2, and the collectors thereof are grounded via resistors R11, R21 respectively while being connected to the bases of emitter follower transistors Q51, Q61 respectively. The emitters of the transistors Q51, Q61 are connected via current sources $I_{21}$, $I_{31}$ to the power source $V_{EE}$ while being also connected, as the output terminals of the selector $2_1$, to the other ends of the aforementioned capacitance elements Cb1, Ca1. Since the output terminals have a low impedance, there arises no particular problem with regard to the time constant even if the wiring length thereat becomes long.

Figure 4:
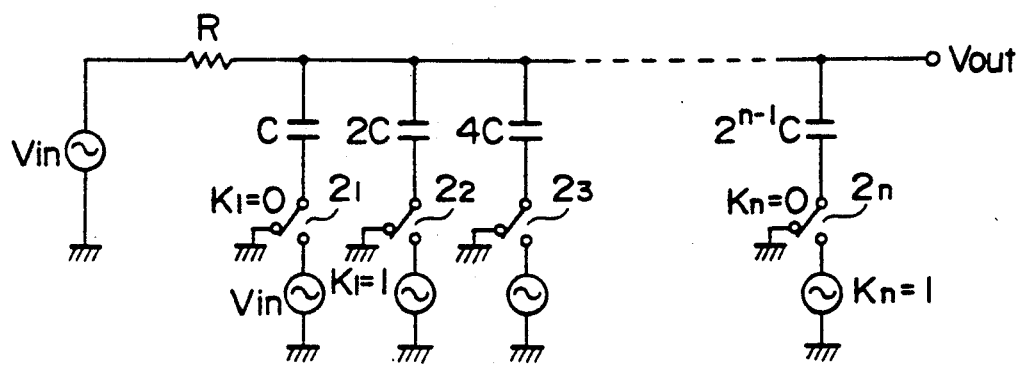
FIG. 4 is an equivalent circuit diagram of FIG. 3 schematically showing the embodiment of the present invention.

FIG. 4 is an equivalent circuit diagram schematically showing the circuit configuration of FIG. 3, wherein Vin is an input signal to be delayed, Vout is an output signal delayed by and delivered from the delay circuit, and R is the resistance value of the resistance elements Ra, Rb. In this case, the output signal is expressed as $$V_{out} = \frac{1}{1 + j\omega CR(2^n - 1)} V_{in} - \frac{j\omega CR}{1 + j\omega CR(2^n - 1)} K_1 V_{in} \quad (1)$$

$$\frac{j\omega 2CR}{1 + j\omega CR(2^n - 1)} K_2 V_{in} - \frac{j\omega 2^{n-1} CR}{1 + j\omega CR(2^n - 1)} K_n V_{in}$$

where K1 ... Kn are coefficients to determine the signal level applied to the other ends of the capacitance elements Ca1 ... Can and may take any arbitrary value. In this embodiment, the value is 0 or 1. Then Eq. (1) may be rewritten as $$V_{out} = \frac{1 - j\omega CR \cdot N}{1 + j\omega CR(2^n - 1)} V_{in} \quad (2)$$

where N is an integer ranging from 0 to $2^n - 1$. The phase $\theta$ of the input signal Vin to the output signal Vout is expressed as $$\tan\theta = \frac{\omega CR(N + 2^n - 1)}{1 - (\omega CR)^2 N(2^n - 1)} \quad (3)$$

Accordingly, $$\frac{d}{d\omega}(\tan\theta) = -\frac{CR(N + 2^n - 1)\{1 + (\omega CR)^2 N(2^n - 1)\}}{\{1 - (\omega CR)^2 N(2^n - 1)\}^2} \quad (4)$$

Meanwhile the delay time is given by $$\tau d = -\frac{d\theta}{d\omega}.$$

Therefore, $$\frac{d}{d\omega}(\tan\theta) = (1 + \tan^2\theta)\frac{d\theta}{d\omega} \quad (5)$$

From Eqs. (4) and (5), the delay time is expressed as $$\tau d = \frac{CR(N + 2^n - 1)\{1 + (\omega CR)^2 N(2^n - 1)\}}{\{1 + (\omega CR)^2 N^2\}\{1 + (\omega CR)^2 (2^n - 1)^2\}} \quad (6)$$

In a frequency range where $\omega CR \ll 1$, $$\tau d \doteq CR(N + 2n - 1) \quad (7)$$

Figure 5:
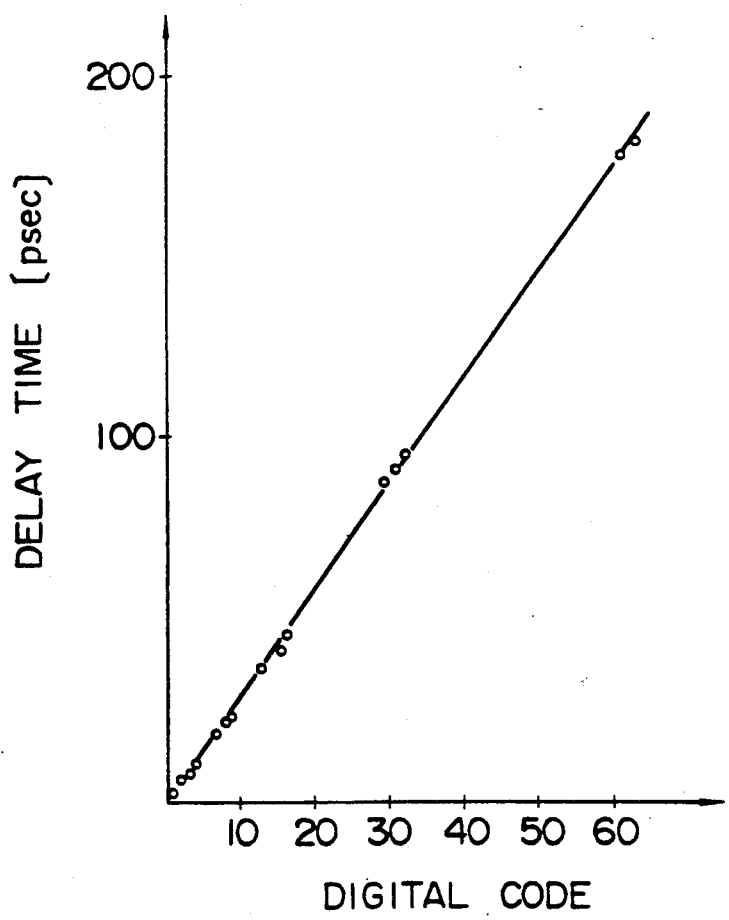
FIG. 5 graphically plots the delay characteristics of the embodiment shown in FIG. 3.

Consequently, high-linearity delay characteristics can be achieved by changing the numerical value N from 0 through $2^n - 1$. The result of simulating such delay characteristics is graphically plotted in FIG. 5.

Thus, in the constitution where such n-stage capacitance elements Ca1, Ca2 ... Can and Cb1, Cb2 ... Cbn having capacitance values of C, 2C ... $2^{n-1}$C respectively and each connected at one end thereof to the output ends of resistors Ra, Rb inserted respectively between the input terminals IN1, IN2 and the output terminals OUT1, OUT2, it becomes possible to change the time constant of the CR time constant circuit by selectively applying to the other ends of the capacitance elements either a signal of the opposite phase with respect to the input signal Vin or a reference potential level. Due to using the base-collector coupling capacitance Cjc of the transistor as a unit capacitance value C, none of the direct current comes to flow into the resistance element R even by switching the capacitance C of the CR time constant circuit in accordance with the base-collector coupling capacitance Cjc. Furthermore, since the base-collector coupling capacitance Cjc is as small as 10 pF or so, it follows that the high-linearity delay characteristics shown in FIG. 5 can be realized on the order of picosecond.

The above embodiment represents an exemplary case where the level of the opposite-phase signal applied to the other ends of the n-stage capacitance elements Ca1 through Can and Cb1 through Cbn is the same (Kn=1) as that of the input signal. However, the level of the opposite-phase signal can be varied by setting Kn to any desired value, and therefore the delay time is rendered adjustable by this means as well.

In addition to the above embodiment where a signal of the opposite phase with respect to the input signal is applied to the other ends of the n-stage capacitance elements Ca1 through Can and Cb1 through Cbn, it is also possible to apply an in-phase signal. In this case, the term $(2^n - 1)$ in Eq. (7) is eliminated to consequently attain satisfactory frequency characteristics.

Figures 6, 7:
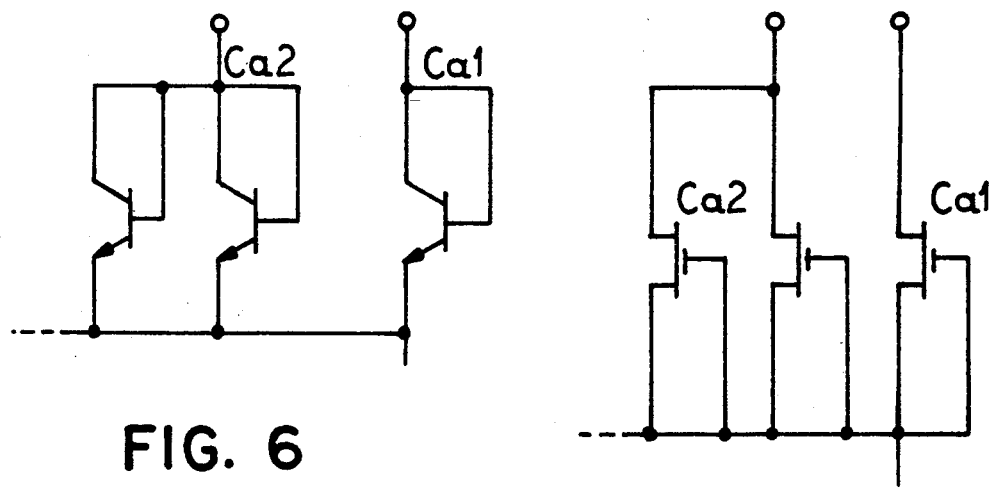
FIG. 6 is a fragmentary diagram of an alternative arrangement for the circuit of FIG. 3.
FIG. 7 is a fragmentary diagram of another alternative arrangement for the circuit of FIG. 3.

Furthermore, besides the above embodiment where the unit capacitance value C is based on the base-collector coupling capacitance Cjc of the transistor whose base and emitter are short-circuited, similar effects can also be achieved by using, as the unit capacitance value C, the base-emitter junction capacitance Cje or the base-collector coupling capacitance Cjc of the transistor whose collector and emitter are short-circuited, as shown in FIGS. 3 and 6 respectively. In the base-emitter junction capacitance Cje of the transistor, the capacitance Cj is expressed as Cj=Cjc+Cje. It is a matter of course that each capacitance element can be composed of a MIS capacitor as shown in FIG. 7.

According to the present invention, as described hereinabove, n-stage capacitance elements having capacitance values of C, 2C ... $2^{n-1}$C respectively are each connected at one end thereof to the output ends of resistance elements inserted between input terminals and output terminals, and the time constant of the CR time constant circuit can be changed by selectively applying to the other ends of such capacitance elements either a signal of the opposite-phase (or in-phase) with respect to the input signal or a reference potential level, hence attaining an advantageous effect that delays the input signal for a desired delay time.

And further by using the base-collector coupling capacitance Cjc of the transistor or the base-emitter junction capacitance Cje thereof as a unit capacitance value C, none of the direct current comes to flow into the resistance elements even by switching the capacitance C of the CR time constant circuit in accordance with the base-collector coupling capacitance Cjc or the base-emitter junction capacitance Cje, thereby ensuring high-linearity delay characteristics on the order of picosecond.

What is claimed is:

1. A programmable delay circuit comprising:

input terminals supplied with input signals to be delayed;

output terminals for delivering the delayed signals therefrom;

resistance elements each coupled between respective one of said input terminals and said output terminals;

n-stage capacitance elements having capacitance values of $C, 2C, 4C \ldots 2^{n-1}C$ respectively (where C is a unit capacitance value) and each connected at one end thereof to respective ends of said resistance elements; and n-stage selection means for selectively applying to respective ends of said n-stage capacitance elements either a signal having an opposite-phase or in-phase relation to said input signal, or a reference potential level.

2. The programmable delay circuit according to claim 1, wherein the unit capacitance value C of said capacitance elements is based on a base-collector coupling capacitance or a base-emitter junction capacitance of the transistor whose base-and-collector or base-and-emitter are short-circuited, respectively.

3. The programmable delay circuit according to claim 1, wherein said capacitance elements are composed of MIS capacitors.

* * * * *